Figure 1:
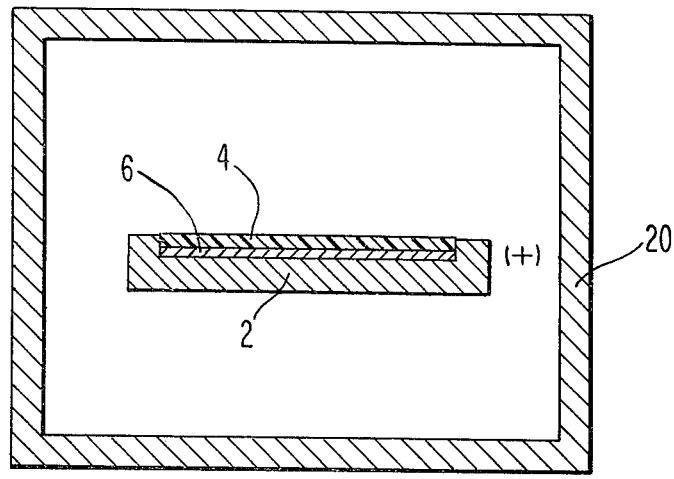

United States Patent [19]

Ferren et al.

[11] 4,127,681
[45] Nov. 28, 1978

[54] SINGLE ELECTRODE POLING OF DIELECTRIC FILMS

[75] Inventors: Richard A. Ferren, Ambler; Peter F. Radice, King of Prussia, both of Pa.

[73] Assignee: Pennwalt Corporation, Philadelphia, Pa.

[21] Appl. No.: 726,382

[22] Filed: Sep. 24, 1976

[51] Int. Cl.$^2$ .............................................. B05D 5/12
[52] U.S. Cl. ................................... 427/100; 264/22; 427/123; 252/500; 307/88 ET; 29/592 E; 179/111 E; 179/181 R
[58] Field of Search ................. 264/22; 427/100, 123; 252/500; 307/88 ET; 179/181 R, 111 E; 29/592

[56] References Cited

U.S. PATENT DOCUMENTS

| | | | |
|---|---|---|---|
| 3,912,830 | 10/1975 | Murayama | 427/100 |
| 3,924,324 | 12/1975 | Kodera | 307/88 ET |
| 4,014,091 | 3/1977 | Kodera | 307/88 ET |

OTHER PUBLICATIONS

Kawai, H., Piezoelectricity of Poly(vinylidene Fluoride), Japan, J. Applied Physics, vol. 8, 975–976, 1969.

*Primary Examiner*—John T. Goolkasian

[57] ABSTRACT

A polarized pellicular resin article is prepared by bringing one surface of a pellicle of a polarizable, dielectric resin into intimate contact with a single electroconductive surface and charging said electroconductive surface with an electric potential at least sufficient to polarize said pellicular resin article.

11 Claims, 3 Drawing Figures

SINGLE ELECTRODE POLING OF DIELECTRIC FILMS

This invention relates to the preparation of polarized pellicular resin articles. More particularly, it relates to a method of preparing electrets and piezoelectric or pyroelectric pellicular articles from polarizable, dielectric resins wherein a single electrode is employed.

Distinctions between electrets, piezoelectric elements and pyroelectric elements are well known to those skilled in this art. However, polarization of resin films to obtain electret, piezoelectric or pyroelectric effects is generally carried out using a similar conventional procedure which involves placing the pellicle in a gap between two electrodes in a circuit and applying an electrical potential across the electrodes sufficient to polarize the resin article. Heating and subsequent cooling are frequently carried out during application of the electric potential to influence retention of the charges. With regard to piezoelectric and pyroelectric elements, this poling process is said to align dipoles in the material between the electrodes.

The above described conventional method of imposing an electric field is often strong enough to breakdown a portion of the pellicular resin article and cause an electric discharge through it. Many resins, during electrical breakthrough, carbonize and form conductive paths through the pellicle resulting in an undesirable number of failures in the preparation of suitable electrets and piezo-or pyroelectric elements during the polarizing process.

In accordance with the present invention, a polarized pellicular resin is prepared by bringing one surface of a pellicle of a polarizable, dielectric resin into intimate contact with a single electroconductive surface which is the sole electrode in an ungrounded electrical circuit and charging said electroconductive surface with an electric potential at least sufficient to polarize said pellicular resin.

Among the advantages which are obtained with the method of this invention are the ability to employ extremely high electrical potentials in polarizing pellicular resin articles without attendant breakdown of the resin, and the relative ease of forming highly polarized pellicular articles of different shapes.

Polarizable, dielectric materials which are suitable for this process include thermoplastic, crosslinkable thermoplastic, thermosettable or curable resins of many types. Examples of such resins taught in the prior art to be useful for forming electrets include polyesters, polyolefins, polyamides, poly (amino acids), polycarbonates, various cellulose derivatives, polyvinyl acetate, polystyrene, polyacrylonitriles, polyacrylates, polysulfons, polyvinylidene cyanide and poly (halogenated olefins) e.g., vinylidene fluoride polymers, vinylidene chloride polymers, vinyl chloride polymers, vinyl fluoride polymers, tetrafluoroethylene polymers, chlorotrifluoroethylene polymers and the like. Such polymers include homopolymers and copolymers or terpolymers of the resins as well as resin mixtures or blends. Preferred resins for the formation of piezoelectric and pyroelectric elements are those containing at least a major mol proportion of vinylidene fluoride in the polymer chain including, for example, vinylidene fluoride homopolymer and copolymers or terpolymers of at least 65 mol percent of vinylidene fluoride and at least one other copolymerizable monomer which preferably includes tetrafluoroethylene and vinyl fluoride. Vinylidene fluoride resins are conventionally produced by either suspension or emulsion polymerization procedures.

Pellicles, for example, films and sheets of these resins may be preformed and brought into intimate contact with the electroconductive surface (electrode) or the pellicle may be formed in situ on the electrode surface. Solvent solutions, organic liquid dispersions and aqueous dispersions of the resins may be cast as films or sheets on a flat or curved electrode surface and subjected to a high electric potential either before, during or after the solidification, coalescence or fusion of the resin. A pellicle may be formed directly on the electrode by an electrostatic coating process, by fusion of thermoplastic resin powders spread on the electrode surface or by other dry forming techniques.

Preformed pellicles may be monoaxially oriented, biaxially oriented or multiaxially oriented by conventional means including blowing, stretching rolling and combinations of these techniques. Preformed pellicles are brought into intimate contact with the surface of the electrode, for example, by uniformly blowing a gas, preferably heated, against the surface of a pellicle having its opposite surface in contact with the electrode surface, or by vacuum means.

For the purpose of this invention, a single thickness preformed film or a multi-ply stack of films or sheets may be poled. When in the form of a stack, the stack may be considered as a single thickness such that only the outer surface of an outer ply is brought into intimate contact with the electrode surface.

Pellicles prepared in situ on the single electrode are preferably formed by casting a solvent solution of the resin on the electrode surface, applying a high potential to the electrode and heating the solution to a temperature above which the solvent volatilizes. After the solvent is substantially removed, the film is cooled down and the charge on the electrode is removed. When employing the preferred vinylidene fluoride polymer resin, suitable solvents include, for example, dimethylacetamide, diethylacetamide, dimethylformamide, diethylformamide, methylethylketone, diisobutylketone, dimethylsulfoxide, tetraethylurea, triethylphosphate, and mixtures of these solvents with themselves and organic liquid diluents. Solvents and liquid carriers for other resins are well known to those skilled in this art. The temperatures at which solvent or other liquid media removal occurs will vary for the particular liquid employed to carry the resin and those skilled in this art will recognize the temperature limitations required to remove solvent or other liquid without damage to the resulting pellicle. A preferred temperature range is from about 50° to 150° C., more preferably from about 100° to 130° C. Liquid removal may also be carried out in a vacuum with or without elevated temperature.

Elevated temperatures, i.e., from above room temperature to just below the melt temperature of the resin employed, preferably about 50° to about 150° C., are also used to aid in poling of the resin pellicle by promoting alignment of dipoles and in inducing an external electric field in and on the resin. To promote good retention of these charges in many resins, the pellicle is allowed to cool after the heat treatment while maintaining the high electric potential.

It is frequently important to provide pellicular electrets, piezoelectric and pyroelectric elements having permanent conductive surfaces coated thereon or laminated thereto. Oriented or unoriented preformed films are coated on one or both sides with conductive materials e.g., aluminum, zinc, gold, tin, chrome, nickel and the like by vapor deposition, electroplating, painting, sputtering, laminating and the like.

Pellicles formed in situ on the electrode surface are conveniently metallized by first placing or forming a very thin metal foil or grid on the electrode and casting the liquid film composition on top of this foil to ultimately form a monolith structure which can then have the opposite face metallized with either a continuous layer or an array of discrete metallic areas. The metal foil or grid which contacts the electrode surface then itself, becomes the electrode surface to which the pellicle surface is in intimate contact.

The method of this invention, while described in the following specific examples as a stationary process, may also be carried out in a continuous manner, for example, by employing a moving electrode belt and moving pellicle which are designed to maintain intimate contact while traveling at the same speed through heating and cooling compartments.

Poling of the pellicles in accordance with this invention is carried out on an electrically conductive surface which is usually a highly conductive metal e.g., brass. The portion of the pellicle surface to be charged is brought and maintained in direct contact (electroconductive contact) with the electrode surface. Should only selected portions of the pellicle require poling, only these portions will be in direct contact with the electrode.

A direct current voltage of at least 50 kilovolts (kv.) per centimeter, preferably at least 300 kv./cm. and up to the dielectric strength of the surrounding air is employed for poling in this invention.

In the accompanying drawing,

FIG. 1 is a side sectional view of one embodiment of this invention wherein a container 2 with a flat bottom acts as a single electrode and holds a solution, dispersion or emulsion of a polarizable, dielectric resin 4 cast over a thin electroconductive sheet 6 which has been placed or formed on electrode 2. Heating chamber or oven 20 surrounds the assembly to provide the desired amount of heat therefor.

Figure 2:
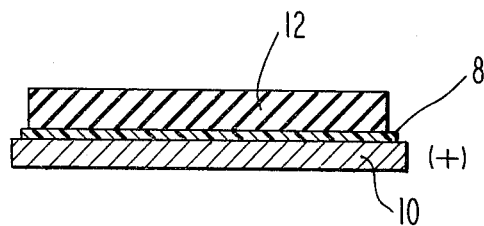

FIG. 2 is a side sectional view of another form of the invention wherein a preformed dielectric film 8 is maintained in intimate surface contact with flat electrode plate 10 by means of a weighted object 12.

Figure 3:
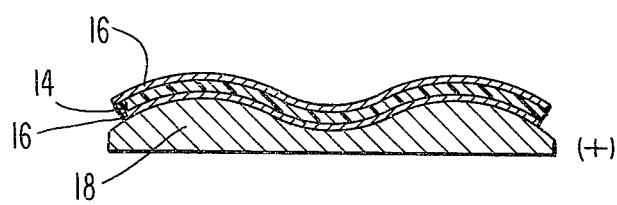

FIG. 3 is a side sectional view of a modification of this invention wherein a preformed film 14 of a dielectric resin having conductive coatings 16 is polarized in contact with irregular shaped electrode 18.

The following examples are set forth to demonstrate this invention.

EXAMPLE I

A vinylidene fluoride homopolymer film having a thickness of 0.7 mil and having both sides vacuum metallized with aluminum was placed between and in contact with two flat brass electrodes. A direct current (d.c.) voltage was applied to the electrodes until a electric field of 393 kv./cm. was imposed on the film. The film temperature was raised to and maintained at 120° C. After 10 minutes, dielectric breakthrough occurred and the film could no longer sustain the applied voltage. Numerous repeat runs under these conditions often resulted in failure of the samples indicating the critical nature of the conventional poling process.

EXAMPLE II

A 10 weight percent solution of a 70 weight percent vinylidene fluoride — 30 weight percent tetrafluoroethylene copolymer resin dissolved in dimethylformamide was poured into a brass container plate, as shown in FIG. 1, acting as an electrode plate and a d.c. voltage of 472 kv./cm. (based on dry film thickness) was applied to the electrode plate without grounding the circuit. The temperature of the plate was raised slowly from 27° C. to 100° C. and maintained at this temperature for one-half hour. The temperature was then raised to 130° C. for one hour and then the plate was slowly cooled to 30° C. and the voltage on the plate was removed. The opposite faces of the formed, poled film (1 mil) were then covered with aluminum foil electrodes and the resulting element exhibited a piezoelectric coefficient ($d_{33}$) of 5.6 pC/N (picocoulombs/Newton). An unpoled film cast in the same way, demonstrated only 0.028 pC/N activity.

EXAMPLE III

A sample of 0.4 mil polyester film metallized on one side was placed, metallized side down, on a single brass electrode. The film was poled with 4700 kv./cm. applied to the brass electrode without grounding the circuit for one hour at 135° C. The film was then slowly cooled to 30° C. and the voltage on the plate was removed. The film exhibited a piezoelectric coefficient of ($d_{33}$) of 0.084 pC/N.

EXAMPLE IV

A sample of poly (vinylidene fluoride) film (1 mil) was poled with a single brass electrode using 3940 kv./cm. without grounding the circuit for 1 hour at 115° C. The film was then slowly cooled to 30° C. and the voltage on the plate (electrode) was removed. The film exhibited a piezoelectric coefficient ($d_{33}$) of 2.2 pC/N.

We claim:

1. A method of preparing a piezoelectric pellicular resin article comprising bringing one surface of a pellicle of a polarizable dielectric resin into intimate contact with an electroconductive surface which is the sole electrode and sole electrical contact of an ungrounded electrical circuit having only one active charging electrode, and charging said electroconductive surface with an electric potential sufficient to polarize and make piezoelectric said pellicular resin article.

2. The method of claim 1 wherein the pellicle is heated to a temperature within the range of just above room temperature to just below the melting point of said resin and the charge on said electroconductive surface is maintained during the heating.

3. The method of claim 2 wherein said resin is a polymer containing at least 65 mol percent of vinylidene fluoride.

4. The method of claim 2 wherein the pellicle is preformed.

5. The method of claim 2 wherein the pellicle is formed in situ on said electroconductive surface.

6. The method of claim 5 wherein the pellicle which is brought into contact with the electroconductive surface is a cast solution of said resin.

7. The method of claim 6 wherein said resin is a polymer containing at least 65 mol percent of vinylidene fluoride.

8. The method of claim 7 wherein the pellicle is heated to a temperature within the range of about 50° to about 150° C.

9. The method of claim 4 wherein the preformed pellicle has an electroconductive coating firmly secured on at least one side thereof.

10. The method of claim 5 wherein an electroconductive layer is placed on said electroconductive surface prior to forming the pellicle in situ.

11. The method of claim 10 wherein the pellicle which is brought in contact with the electroconductive surface is a cast solution of a polymer containing at least 65 mol percent vinylidene fluoride, and the pellicle is heated within the range of about 50° to 150° C. until solidified and then permitted to cool while the charge is maintained.

* * * * *